United States Patent [19]
Nagai

[11] Patent Number: 6,133,071
[45] Date of Patent: Oct. 17, 2000

[54] SEMICONDUCTOR DEVICE WITH PLATE HEAT SINK FREE FROM CRACKS DUE TO THERMAL STRESS AND PROCESS FOR ASSEMBLING IT WITH PACKAGE

[75] Inventor: Keiji Nagai, Tokyo, Japan

[73] Assignee: NEC Corporation, Tokyo, Japan

[21] Appl. No.: 09/172,862

[22] Filed: Oct. 15, 1998

[30] Foreign Application Priority Data

Oct. 15, 1997 [JP] Japan ..................... 9-282240

[51] Int. Cl.⁷ ................ H01L 21/50; H01L 21/84; H01L 21/30; H01L 21/46; H01L 23/34
[52] U.S. Cl. .............. 438/122; 438/150; 438/457; 438/455; 257/712; 257/730
[58] Field of Search .................. 438/122, 150, 438/457, 455, 378; 257/712, 718, 730, 675

[56] References Cited

U.S. PATENT DOCUMENTS

| | | |
|---|---|---|
| 3,593,412 | 7/1971 | Foote ........................ 29/589 |
| 5,071,785 | 12/1991 | Nakazato et al. ................ 437/62 |
| 5,783,477 | 7/1998 | Kish, Jr. et al. ................ 438/455 |
| 5,801,084 | 9/1998 | Beasom et al. ................ 438/457 |

FOREIGN PATENT DOCUMENTS 60-160623   8/1985   Japan.

*Primary Examiner*—Wael Fahmy
*Assistant Examiner*—Neal Berezny
*Attorney, Agent, or Firm*—Sughrue, Mion, Zinn, Macpeak & Seas, PLLC

[57] ABSTRACT

A compound semiconductor pellet for a high electron mobility transistor is bonded to a metal plate heat sink of gold, and the metal plate heat sink is soldered to a package, wherein the metal plate heat sink is subjected to an orientation under application of heat before the soldering so as to cure warp of the compound semiconductor pellet, thereby decreasing the thermal stress due to the heat during the soldering.

10 Claims, 3 Drawing Sheets

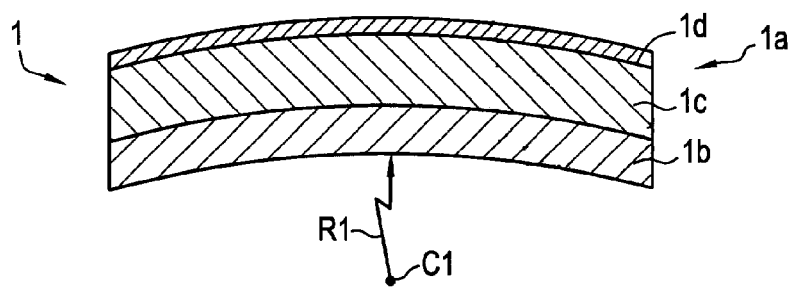
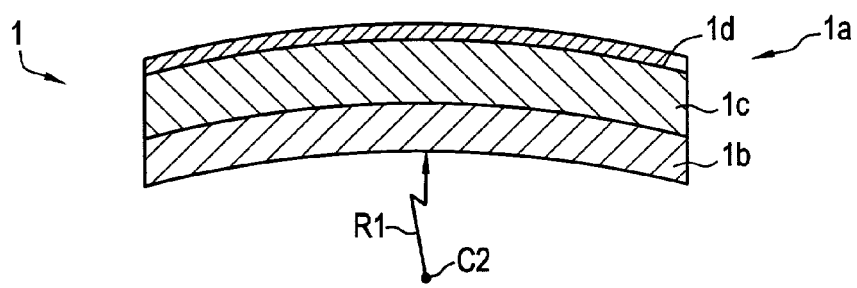
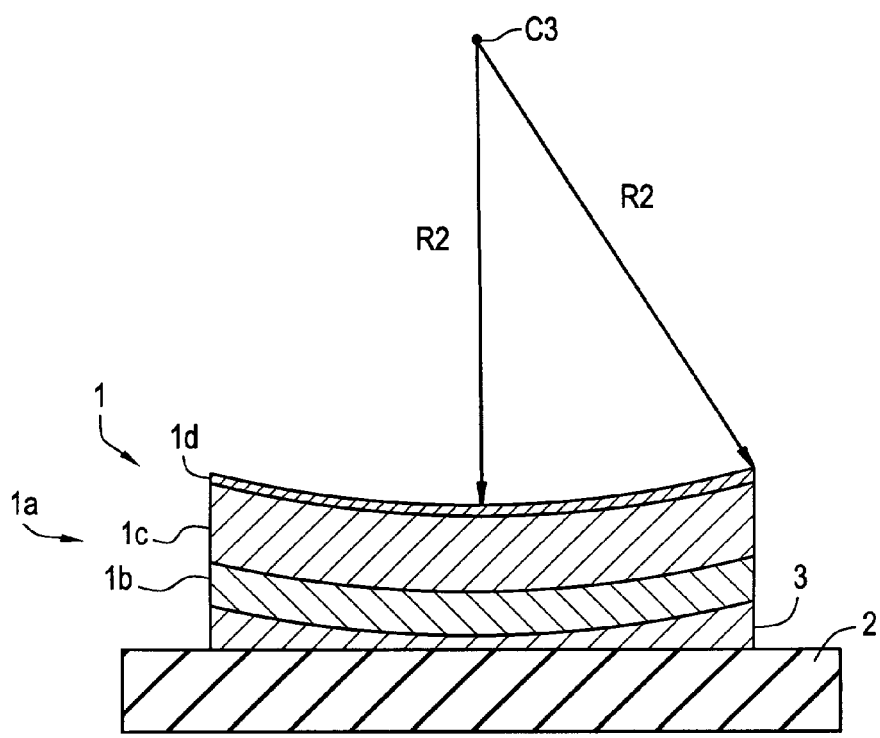

SEMICONDUCTOR DEVICE WITH PLATE HEAT SINK FREE FROM CRACKS DUE TO THERMAL STRESS AND PROCESS FOR ASSEMBLING IT WITH PACKAGE

FIELD OF THE INVENTION

This invention relates to a semiconductor device and, more particularly, to a semiconductor device coated with a plate heat sink and a process of assembling a plate heat sink with a package.

DESCRIPTION OF THE RELATED ART

While an active element such as a transistor is operating, the active element generates heat. If the active element is fabricated on a semiconductor pellet, the active element heats the semiconductor pellet, and the temperature rises. If the active element is a kind of power transistor, the power transistor generates a large amount of heat, and the temperature rise is serious.

Metal usually has the heat transfer coefficient larger than that of the semiconductor material. For this reason, a metal plate is attached to the semiconductor pellet so as to increase the heat radiation capability of the semiconductor device. The metal plate attached to the semiconductor pellet is called as "Plate Heat Sink", and a semiconductor device with the plate heat sink is hereinbelow simply referred to as "plate heat sink device".

A typical example of the plate heat sink device is disclosed in Japanese Patent Publication of Unexamined Application No. 60-160623. The metal plate is larger in thermal expansion coefficient than the semiconductor pellet, and the plate heat sink device is warped due to the thermal stress. As admitted in the Japanese Patent Publication of Unexamined Application, if the metal plate is attached to a wide semiconductor pellet such as 3–4 millimeter square, the warp is not ignoreable, and the stress affects the transistor characteristics. Especially, when a manufacturer fabricates a compound semiconductor transistor such as a high electron mobility transistor on a compound semiconductor pellet, the semiconductor pellet includes a strained lattice layer such as an indium gallium arsenide layer, and the thermal stress due to the metal plate seriously affects the strained lattice layer.

The compound semiconductor pellet is coated with a metal plate, and electrodes are patterned on the compound semiconductor pellet. When the plate heat sink device is soldered to a substrate, the plate heat sink device is warped, and the radius of curvature is of the order of 10 cm. The center is over the compound semiconductor pellet, and, accordingly, compressive force is exerted on the compound semiconductor pellet at all times. The compressive stress is causative of dislocations. In this situation, if the plate heat sink device is placed in high temperature atmosphere at 250 degrees in centigrade for tens hours, the plate heat sink device is warped, and cracks take place in the compound semiconductor pellet. The high electron mobility transistor is deteriorated.

In order to prevent the plate heat sink device from the damage, it is proposed in the Japanese Patent Publication of Unexamined Application to forcibly reform the semiconductor pellet before the fixture to the substrate or a package. Namely, a flat plate is pressed to the semiconductor pellet of the plate heat sink device mounted on the package, and, thereafter, the metal plate is bonded to the package.

The manufacturer encounters a problem in the prior art plate heat sink device in serious damage to the semiconductor pellet, especially, to the strained lattice layer due to the reformative force exerted thereon.

SUMMARY OF THE INVENTION

It is therefore an important object of the present invention to provide a plate heat sink device, which is less damaged under heat.

It is also an important object of the present invention to provide a process for fabricating the plate heat sink device.

To accomplish the object, the present invention proposes to previously reform a plate heat sink device before bonding it to a substrate under application of heat.

In accordance with one aspect of the present invention, there is provided a semiconductor device comprising a plate heat sink device including a semiconductor pellet having a first major surface, a second major surface and at least one active element fabricated between the first major surface and the second major surface and a metal plate heat sink bonded to the second major surface for radiating heat generated by the at least one active element and having a crystal structure oriented in a certain direction for increasing a length along the boundary with the second major surface, a substrate for mounting the plate heat sink device, and a solder layer for bonding the plate heat sink device to the substrate.

In accordance with another aspect of the present invention, there is provided a process for assembling a plate heat sink device with a substrate, comprising the steps of preparing a plate heat sink device including a semiconductor pellet and a metal plate heat sink bonded to a first major surface of the semiconductor pellet and warped so as to have a radius of curvature of a first value, treating the plate heat sink device with heat so as to orient crystal grains of the metal plate heat sink to a predetermined plane thereby increasing the radius of curvature from the first value to a second value, and bonding the plate heat sink device to a substrate under application of heat so as to keep the radius of curvature greater than a third value with which the plate heat sink device is warped if the bonding is carried out without the step b).

BRIEF DESCRIPTION OF THE DRAWINGS

The features and advantages of the plate heat sink device and the fabrication process will be more clearly understood from the following description taken in conjunction with the accompanying drawings in which:

FIGS. 1A to 1C are cross sectional views showing a process for assembling a plate heat sink device with a package according to the present invention;

DESCRIPTION OF THE PREFERRED EMBODIMENT

Figure 2:
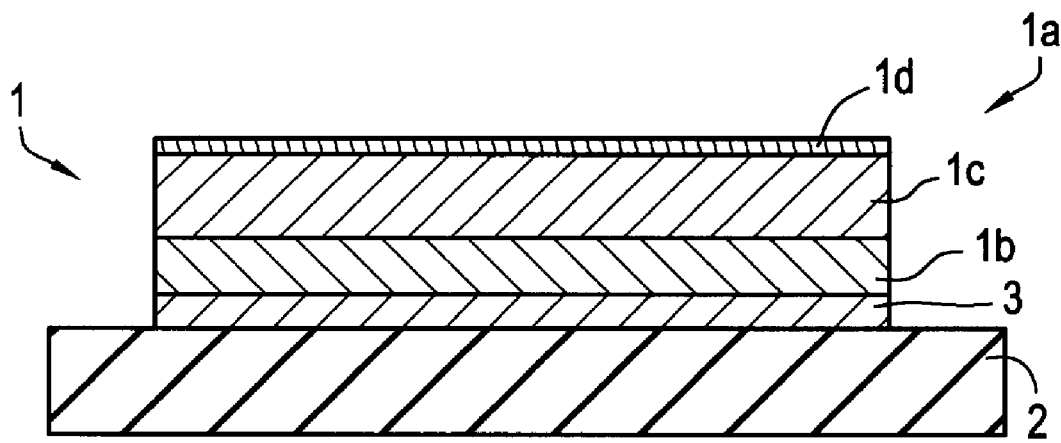
FIG. 2 is a cross sectional view showing the structure of another plate heat sink device according to the present invention.

FIGS. 1A to 1C illustrate a process for assembling a plate heat sink device with a package embodying the present invention. The process starts with preparation of a plate heat sink device 1. The plate heat sink device 1 largely comprises a semiconductor pellet 1a and a metal plate heat sink 1b formed on a reverse surface of the semiconductor pellet 1a. Indium gallium arsenide is epitaxially grown on a gallium arsenide layer 1c, and forms a strained lattice layer. Though not shown in the drawings, electrodes are formed on the indium gallium arsenide layer 1d, and the gallium arsenide layer 1c and the indium gallium arsenide layer 1d serve as essential parts of a high electron mobility transistor. In this instance, the gallium arsenide layer 1c is 30 microns to 50 microns thick, and the indium gallium arsenide layer 1d is 10 nanometers to 15 nanometers thick.

The metal plate heat sink 1b is bonded to the reverse surface of the gallium arsenide layer 1c, and is formed of gold. The metal plate heat sink 1b of gold imparts good heat radiation capability to the plate heat sink device 1. In this instance, the metal plate heat sink 1b is 10 microns to 30 microns thick. The internal stress of the metal plate heat sink 1b slightly warps the plate heat sink device 1, and the radius of curvature R1 ranges from 25 cm to 100 cm, and the center C1 is on the opposite side to the indium gallium arsenide layer 1d with respect to the metal plate heat sink 1b as shown in FIG. 1A. As a result, a small amount of tensile stress takes place in the indium gallium arsenide layer 1d.

Subsequently, the metal plate heat sink 1b is subjected to an orientation. In detail, the plate heat sink device 1 is heated at 200 degrees to 300 degrees in centigrade for 30 minutes, and the orientation of the crystal grains of gold are changed from (111) plane to the combination of (11) plane and (200) plane. Prior to the heat treatment at least 200 degrees in centigrade for at least 30 minutes, although the gold is not single crystal, (111) plane is almost 100 percent. After the heat treatment, the gold contains (111) plane about 70 percent and (200) plane about 30 percent. Of course, the gold is not single crystal after the heat treatment. The metal plate heat sink 1b is elongated, and the radius of curvature is R1 is increased from 10 cm to 20 cm as shown in FIG. 1B. The center C2 becomes closer than the center C1, and the tensile stress in the indium gallium arsenide layer 1d is increased.

Finally, the plate heat sink device 1 is soldered to a package 1. In this instance, the solder layer 3 is formed of AuSn. The solder layer 3 is heated around 300 degrees in centigrade, and the metal plate heat sink 1b is soldered to the package 2. The metal plate heat sink 1b is subjected to heat during the soldering, and raises the metal plate heat sink 1b over 300 degrees in centigrade for one minute. The heat warps the plate heat sink device 1, and the radius of curvature R2 becomes greater than 20 cm. The center C3 is moved to the same side as the indium gallium arsenide layer 1d with respect to the metal plate heat sink 1b as shown in FIG. 1C.

Figure 3:
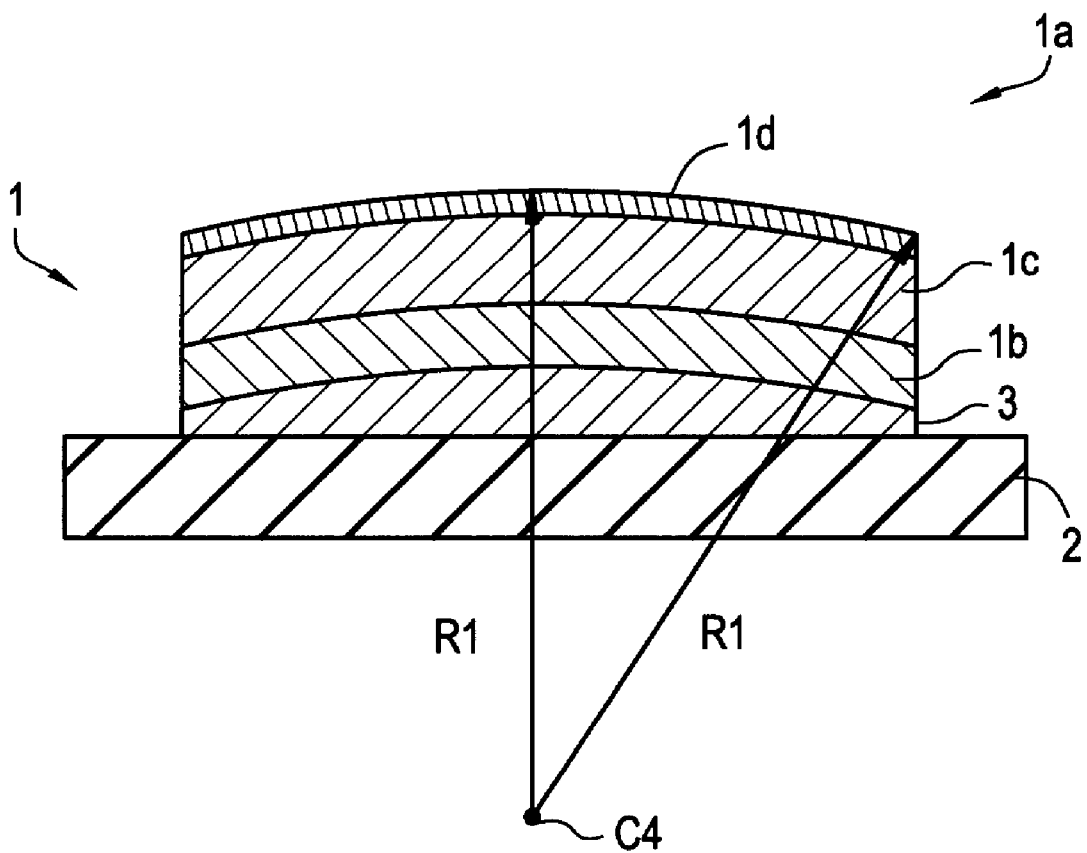
FIG. 3 is a cross sectional view showing the structure of yet another plate heat sink device according to the present invention.

The thermal energy during the soldering may make the plate heat sink device 1 flat as shown in FIG. 2. If a small amount of thermal energy is applied to the plate heat sink device 1 during the soldering, the center C4 is still on the opposite side to the indium gallium arsenide layer 1d with respect to the metal plate heat sink 1b, and the radius of curvature R1 is further increased as shown in FIG. 3.

Thus, the thermal stress in the indium gallium arsenide layer 1d is further decreased, and the indium gallium arsenide layer 1d allows the high electron mobility transistor to continuously operate without deterioration for a time period longer than that of the prior art.

Figure 4:
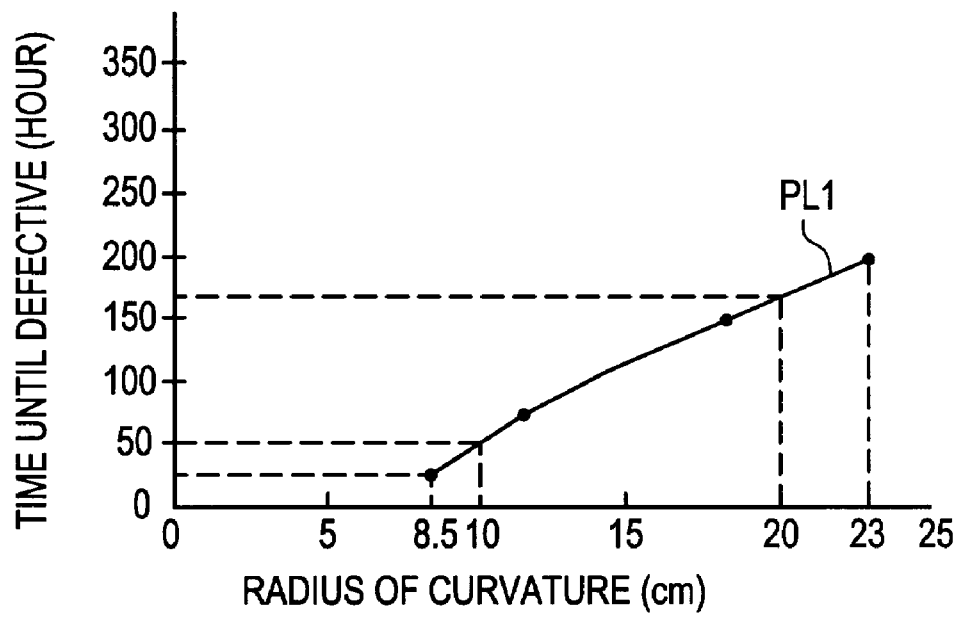
FIG. 4 is a graph showing a relation between the radius of curvature and a time until defective.

The present inventor investigated the effect of the orientation. The present inventor prepared samples of the plate heat sink device described hereinbefore and comparative samples. The orientation was not carried out for the comparative samples, and the comparative samples had the radius of curvature equal to 8.5 cm. On the other hand, the samples subjected to the orientation had the radius of curvature R1/R2 greater than 20 cm. The samples and the comparative samples were heated to 250 degrees in centigrade, and measured a time period until defective. The time period was plotted as indicated by line PL1 in FIG. 4. When the radius of curvature R1/R2 was 23 cm, the time period was 250 hours, which was ten times longer than that of the comparative samples. The time period of 250 hours at 250 degrees in centigrade was equivalent to 3 E6 hours at 130 degrees in centigrade. The high electron mobility transistor was usually operating under the channel temperature at 130 degrees in centigrade, and was expected to operate for at least 1 E6 hours at 130 degrees. The minimum running time 1 E 6 was equivalent to 150 hours at 250 degrees in centigrade. For this reason, the minimum radius of curvature was 18 cm, and the present inventor confirmed that the orientation was effective against the undesirable deterioration due to the thermal stress.

Figure 5:
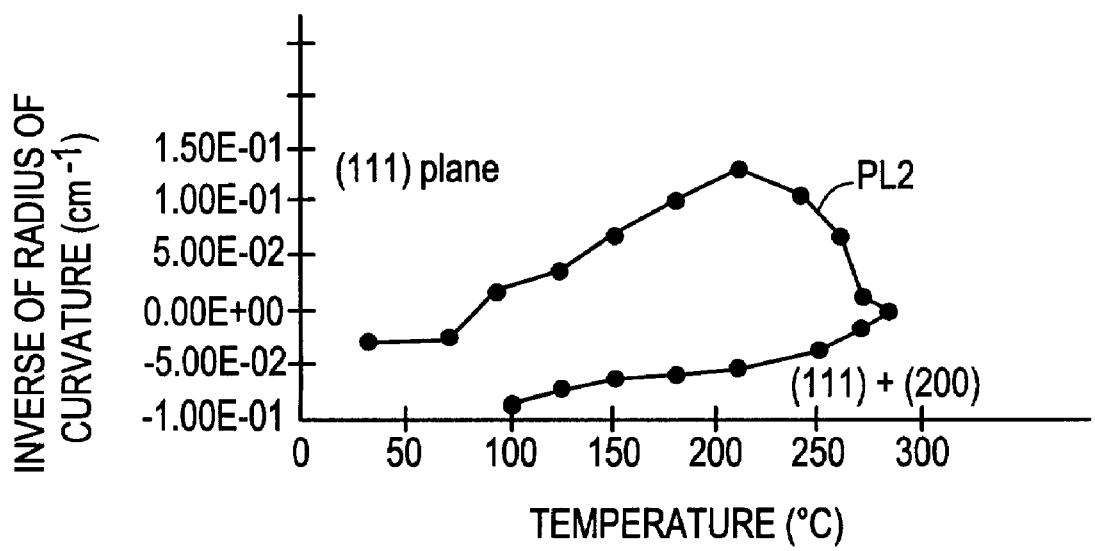
FIG. 5 is a graph showing a relation between the temperature and the inverse of radius of curvature.

The present inventor further investigated the orientation. The present inventor prepared samples of the plate heat sink device, and varied the crystal structure of the metal plate heat sink. When the crystal structure was varied from (111) plane to (111) plane and (200) plane, the inverse of radius of curvature was changed over zero as indicated by plots PL2 in FIG. 5. Thus, the crystal structure directly affected the radius of curvature R1.

As will be appreciated from the foregoing description, the plate sink device is subjected to the orientation before the soldering, and the radius of curvature is appropriately regulated before the soldering. As a result, even though the plate heat sink device is warped during the soldering, the warp is gentle, and the semiconductor chip is less damaged due to the thermal stress.

Although particular embodiments of the present invention have been shown and described, it will be apparent to those skilled in the art that various changes and modifications may be made without departing from the spirit and scope of the present invention.

For example, a combination of different kinds of compound semiconductor may realize a high speed circuit component different from the high electron mobility transistor.

What is claimed is:

1. A process for assembling a plate heat sink device with a substrate, comprising, the steps of:

a) preparing a plate heat sink device including a semiconductor pellet and a metal plate heat sink bonded to a first major surface of said semiconductor pellet and warped so as to have a radius of curvature of a first value;

b) treating said plate heat sink device with heat so as to orient crystal grains of said metal plate heat sink to a predetermined plane, thereby increasing said radius of curvature from said first value to a second value; and c) bonding said plate heat sink device to a substrate under application of heat so as to keep said radius of curvature greater than a third value, said third value defined as being the radius of curvature resulting from warpage of said plate heat sink device when the bonding is carried out without said step b).

2. The process as set forth in claim 1, in which said plate heat sink device is bonded to said substrate by using a soldering.

3. The process as set forth in claim 2, in which soldering material used in said c) is melted around 300 degrees in centigrade.

4. The process as set forth in claim 2, in which said semiconductor pellet and said metal plate heat sink are mainly formed of gallium arsenide and gold, respectively, and said gold is subjected to the orientation under the conditions at 200 degrees to 300 degrees in centigrade for about 30 minutes in said step b).

5. The process as set forth in claim 4, in which said orientation is changed from (111) plane to a combination of (111) plane and (200) plane.

6. The process as set forth in claim 1, in which a center for said radius of curvature is on the opposite side to said semiconductor pellet with respect to said metal plate heat sink in said step a) and said step b), and said center is moved to the same s ide as said semiconductor pellet with respect to said metal plate heat sink.

7. The process as set forth in claim 1, in which a center for said radius of curvature is on the opposite side to said semiconductor pellet with respect to said metal plate heat sink in said step a) and said step b), and said plate heat sink device becomes substantially flat in said step c).

8. The process as set forth in claim 1, in which a center for said radius of curvature is on the opposite side to said semiconductor pellet with respect to said metal plate heat sink in said step a), said step b) and said step c).

9. The process as set forth in claim 4, in which said semiconductor pellet and said metal heat sink are about 30 microns to about 50 microns thick and 10 microns to 30 microns thick, respectively, and said radius of curvature is changed from 10 cm in said step a) through 20 cm in said step b) to more than 20 cm in said step c).

10. The process as set forth in claim 9, in which said semiconductor pellet has a the gallium arsenide layer of 30 microns to 50 microns thick and an indium gallium arsenide layer of 10 nanometers to 15 nanometers thick epitaxially grown on a major surface of said gallium arsenide opposite to said major surface where said metal plate heat sink is bonded.

* * * * *